United States Patent
Tanabe et al.

(10) Patent No.: US 8,866,510 B2
(45) Date of Patent: Oct. 21, 2014

(54) SEMICONDUCTOR DEVICE

(71) Applicant: Semiconductor Energy Laboratory Co., Ltd., Atsugi (JP)

(72) Inventors: Toru Tanabe, Kanagawa (JP); Hiroyuki Miyake, Kanagawa (JP)

(73) Assignee: Semiconductor Energy Laboratory Co., Ltd., Kanagawa-ken (JP)

(*) Notice: Subject to any disclaimer, the term of this patent is extended or adjusted under 35 U.S.C. 154(b) by 0 days.

(21) Appl. No.: 13/871,127

(22) Filed: Apr. 26, 2013

(65) Prior Publication Data

US 2013/0292669 A1 Nov. 7, 2013

(30) Foreign Application Priority Data

May 2, 2012 (JP) ................. 2012-105278

(51) Int. Cl.
*H03K 19/00* (2006.01)
*H01L 27/02* (2006.01)
*H03K 3/03* (2006.01)

(52) U.S. Cl.
CPC .......... *H01L 27/0218* (2013.01); *H03K 3/0315* (2013.01)
USPC ................. 326/93; 326/83; 326/95; 326/112; 326/119

(58) Field of Classification Search
None
See application file for complete search history.

(56) References Cited

U.S. PATENT DOCUMENTS

| 5,731,856 | A | 3/1998 | Kim et al. |
| 5,744,864 | A | 4/1998 | Cillessen et al. |
| 5,912,591 | A * | 6/1999 | Yamada .......................... 331/57 |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 7,049,190 | B2 | 5/2006 | Takeda et al. |
| 7,061,014 | B2 | 6/2006 | Hosono et al. |
| 7,064,346 | B2 | 6/2006 | Kawasaki et al. |
| 7,105,868 | B2 | 9/2006 | Nause et al. |

(Continued)

FOREIGN PATENT DOCUMENTS

| EP | 1 737 044 A1 | 12/2006 |
| EP | 2 226 847 A2 | 9/2010 |

(Continued)

OTHER PUBLICATIONS

Ma.T et al., "Unipolar CMOS Logic for Post-Si ULSI and TFT Technologies,", ECS Transactions, Jun. 26, 2011, vol. 37, No. 1. pp. 207-215.

(Continued)

*Primary Examiner* — Anh Tran
(74) *Attorney, Agent, or Firm* — Nixon Peabody LIP; Jeffrey L. Costellia

(57) ABSTRACT

When a semiconductor device is provided with an inverter comprising a transistor having a first gate and a second gate, the semiconductor device does not require a circuit for generating a potential to be input to the second gate of the transistor and has a small number of wirings. Moreover, a semiconductor device having high reliability is provided. The semiconductor device includes a plurality of stages of circuits each provided with two inverter circuits in parallel. Two inverter circuits in a given stage output respective signals of opposite polarities, which is utilized for interchanging signals output from inverter circuits in the previous stage. Thus, an inverted signal is input to the second gate of the transistor included in each of two inverter circuits in the subsequent stage.

19 Claims, 2 Drawing Sheets

(56) References Cited

U.S. PATENT DOCUMENTS

| | | |
|---|---|---|
| 7,211,825 B2 | 5/2007 | Shih et al |
| 7,230,601 B2 | 6/2007 | Yamazaki et al. |
| 7,279,997 B2 * | 10/2007 | Kalpat et al. ............... 331/57 |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 8,067,775 B2 | 11/2011 | Miyairi et al. |
| 8,193,833 B2 | 6/2012 | Inukai |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0040627 A1 | 2/2007 | Kanno et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2011/0181319 A1 * | 7/2011 | Kawahara et al. ............ 326/102 |
| 2011/0193594 A1 | 8/2011 | Inukai |
| 2012/0061668 A1 | 3/2012 | Miyairi et al. |
| 2012/0218000 A1 | 8/2012 | Inukai |

FOREIGN PATENT DOCUMENTS

| | | |
|---|---|---|
| JP | 60-198861 | 10/1985 |
| JP | 63-210022 | 8/1988 |
| JP | 63-210023 | 8/1988 |
| JP | 63-210024 | 8/1988 |
| JP | 63-215519 | 9/1988 |
| JP | 63-239117 | 10/1988 |
| JP | 63-265818 | 11/1988 |
| JP | 05-251705 | 9/1993 |
| JP | 08-264794 | 10/1996 |
| JP | 11-505377 | 5/1999 |
| JP | 2000-044236 | 2/2000 |
| JP | 2000-150900 | 5/2000 |
| JP | 2002-076356 | 3/2002 |
| JP | 2002-289859 | 10/2002 |
| JP | 2003-086000 | 3/2003 |
| JP | 2003-086808 | 3/2003 |
| JP | 2004-103957 | 4/2004 |
| JP | 2004-273614 | 9/2004 |
| JP | 2004-273732 | 9/2004 |
| JP | 2006-217162 | 8/2006 |
| JP | 2011-163983 | 8/2011 |
| WO | WO-2004/114391 A1 | 12/2004 |

OTHER PUBLICATIONS

Fortunato.E et al., "Wide-Bandgap High-Mobility ZnO Thin-Film Transistors Produced at Room Temperature, ", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicont Technology, ", SID Digest '04 : SID International Symposium Digest of Technical Papers, 2004, vol. 35, pp. 860-863.

Nomura.K et al., "Room-Temperature Fabrication of Transparent Flexible Thin-Film Transistors using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-film Transistors by Ar Plasma Treatment,", Appl. Phys. Lett. (Applied Physics Letter), Jun. 26, 2007, vol. 90, No. 26, pp. 262106-1-262106-3.

Takahashi.M et al., "Theoretical Analysis of IGZO Transparent Amorphous Oxide Semiconductor, ", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTS,", SID Digest '08 SID International Symposium Digest of Technical Papers, May 20, 2008, vol. 39, pp. 621-624.

Prins.M et al., "A Ferroelectric Transparent Thin-Film Transistor,", Appl. Phys. Letts. (Applied Physics Letters), Jun. 17, 1996, vol. 68, No. 25, pp. 3650-3652.

(56) References Cited

OTHER PUBLICATIONS

Nakamura.M et al., "The Phase relations in the In2O3-Ga2ZnO4-ZnO system at 1350° C,", Journal of Solid State Chemistry, Aug. 1, 1991, vol. 93, No. 2, pp. 298-315.

Kimizuka. N et al., "Syntheses and Single-Crystal Data of Homologous Compounds, In2O3(ZnO)m (m=3,4, and 5), InGaO3(ZnO)3, and Ga2O3(ZnO)m (m=7,8,9, and 16) in the In2O3-ZnGa2O4-ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics), Feb. 1, 2003, vol. 93, No. 3, pp. 1624-1630

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters), Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous Gizo (Ga2O3-In2O3-ZnO) TFT,", SID International Symposium Digest of Technical Papers, May 20, 2008, vol. 39, pp. 633-636.

Lee.J et al., "World'S Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDS,", SID Digest '09 : SID International Syposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater (Advanced Materials), 2006, vol. 18, No. 3, pp. 339-342.

Tsuda.K et al., "Ultra Low Power Consumption Technologies for Mobile TFT-LCDs,", IDW '02 : Proceedings of the 9th International Display Workshops, Dec 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa,Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp.227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:AL and SN-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and its Bending Properties,", SID Digest '09 : SID International Symposium Disgest of Technical Papers, May 31, 2009, pp. 983-985.

Sakata.J et al., "Development of 4.0-IN. AMOLED Display With Driver Circuit Using Amorphous In—Ga—Zn—Oxide TFTS,", IDW '09 : Proceeding of the 16th International Display Workshops, 2009, pp. 689-692.

Park.J et al., "Amorphous Indium—Gallium—Zinc Oxide TFTS and their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In-Ga-Zn-Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTS) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTS With a Novel Passivation Layer,", SID Digest '09 : SID International Symposium Digest of Technical Papers, May 31, 2009, pp. 284-287.

Miyasaka.M, "Suftla Flexible Microelectronics on their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, July 1, 1995, vol. 42, No. 7, pp. 1240-1246.

Kikuchi.H et al., "39.1:Invited Paper:Optically Isotropic Nano-Structured Liquid Crystal Composites for Display Application,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

(56) References Cited

OTHER PUBLICATIONS

Nakamura.M, "Synthesis of Homologous Compound with New Long-Period Structure,", Nirim Newsletter, Mar. 1, 1995, vol. 150, pp. 1-4

Kikuchi.H et al., "Polymer-Stablized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the IN2O3 and SC2O3-A2O3-BO Systems [A; FE, GA, or AL; B: MG, MN, FE, NI, CU,or ZN] at Temperatures over 1000° C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys (Japanese Journal of Applied Physics) ,2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 85, pp. 122102-1-122102-3.

Oba.F et al., "Defect energetics in ZnO: A hybrid Hartree-Fock density functional study,", Phys. Rev. B. (Physical Review. B), 2008, vol. 77, pp. 2452002-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using Castep,", Zeitschrift fur Kristallographie, 2005, vol. 220, pp. 567-570.

Lany.S et al "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electronchem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

\* cited by examiner

SEMICONDUCTOR DEVICE

BACKGROUND OF THE INVENTION

1. Field of the Invention

One embodiment of the present invention relates to a semiconductor device. In this specification, a semiconductor device refers to a semiconductor element itself or a device including a semiconductor element. As an example of such a semiconductor element, for example, a thin film transistor can be given. Therefore, the semiconductor device includes a liquid crystal display device, a memory device, and the like.

2. Description of the Related Art

A semiconductor device incorporates a variety of circuits for desired operations. One example is an oscillator circuit capable of producing a continuous alternating current. One type of oscillator circuit is a ring oscillator (see, for example, Patent Document 1). Another example, other than the oscillator circuit, is a delay circuit. One type of delay circuit is an inverter chain (see, for example, Patent Document 2).

As a circuit incorporated in a semiconductor device, a complementary metal oxide semiconductor (CMOS) circuit which is a combination of p-channel and n-channel transistors is widely used. However, a p-channel transistor and an n-channel transistor greatly differ in field effect mobility, leading to a variety of inconveniences. The combination of p-channel and n-channel transistors also has the problem of process complication when manufactured over the same substrate.

In view of that, there have been attempts to configure a variety of logic circuits only with transistors having the same conductivity type. For the transistors having the same conductivity type, control of threshold voltage with back gates is particularly desired (for example, see Non-Patent Document 1).

REFERENCES

[Patent Document 1] Japanese Published Patent Application No. 2006-217162
[Patent Document 2] Japanese Published Patent Application No. 2011-163983
[Non-Patent Document 1] T. P. Ma et al., "Unipolar CMOS Logic for Post-Si ULSI and TFT technologies", ECS Transactions, 2011, Vol. 37, pp. 207-215

SUMMARY OF THE INVENTION

However, back gates require a circuit for generating a potential to be input to the back gates or cause an increase in the number of wirings, for example.

It is an object of one embodiment of the present invention to provide a semiconductor device including a circuit configuration, a ring oscillator, or an inverter chain which does not require a circuit for generating a potential to be input to a back gate even when an inverter is formed using a transistor having a back gate.

Alternatively, it is an object of one embodiment of the present invention to provide a semiconductor device including a circuit configuration, a ring oscillator, or an inverter chain in which the number of wirings for supplying signals can be reduced even when an inverter is formed using a transistor having a back gate.

Alternatively, it is an object of one embodiment of the present invention to provide a semiconductor device including a ring oscillator or an inverter chain having high reliability.

One embodiment of the present invention is a semiconductor device which includes a plurality of stages of circuits each provided with two inverter circuits in parallel. Two inverter circuits in a given stage output respective signals of opposite polarities. The two inverter circuits interchange signals output from inverter circuits in the previous stage. An input signal for one of the two inverter circuits is the same as a signal input to a back gate of a transistor included in the other of the two inverter circuits. An input signal for the other of the two inverter circuits is the same as a signal input to a back gate of a transistor included in the one of the two inverter circuits.

One embodiment of the present invention is a semiconductor device which includes an odd number of inverter stages each including a first inverter circuit and a second inverter circuit connected in parallel to each other. The first and second inverter circuits each include first and second input terminals, an output terminal for outputting an inverted signal of a signal input from the first input terminal, and two transistors. The output terminal of the first inverter circuit is electrically connected to a first input terminal of a first inverter circuit in the subsequent stage and a second input terminal of a second inverter circuit in the subsequent stage. The output terminal of the second inverter circuit is electrically connected to a second input terminal of the first inverter circuit in the subsequent stage and a first input terminal of the second inverter circuit in the subsequent stage. The second input terminal of each of the first and second inverter circuits is electrically connected to a back gate of one of the two transistors.

Even when an inverter is formed using a transistor having a back gate, it is possible to obtain a semiconductor device including a circuit configuration, a ring oscillator, or an inverter chain which does not require a circuit for generating a potential to be input to the back gate.

Alternatively, even when an inverter is formed using a transistor having a back gate, it is possible to obtain a semiconductor device including a circuit configuration, a ring oscillator, or an inverter chain in which the number of wirings for supplying signals can be reduced.

Alternatively, it is possible to obtain a semiconductor device including a ring oscillator or an inverter chain having high reliability.

DETAILED DESCRIPTION OF THE INVENTION

Embodiments of the present invention will be described in detail below with reference to drawings. Note that the present invention is not limited to the following description, and it will be easily understood by those skilled in the art that various changes and modifications can be made without departing from the spirit and scope of the present invention. Therefore, the present invention should not be construed as being limited to the description in the following embodiments.

In this embodiment, a semiconductor device in one embodiment of the present invention will be described. The semiconductor device in one embodiment of the present invention includes a circuit configuration illustrated in FIG. 1A.

Note that all transistors in the description below have the same conductivity type. It is thus preferable to use n-channel transistors. This is because n-channel transistors generally have higher field effect mobility than p-channel transistors.

Since all transistors in the description below have the same conductivity type, all advantages such as a simpler manufacturing process than in the case of using CMOS can be enjoyed even if not explained herein.

Figure 1A:
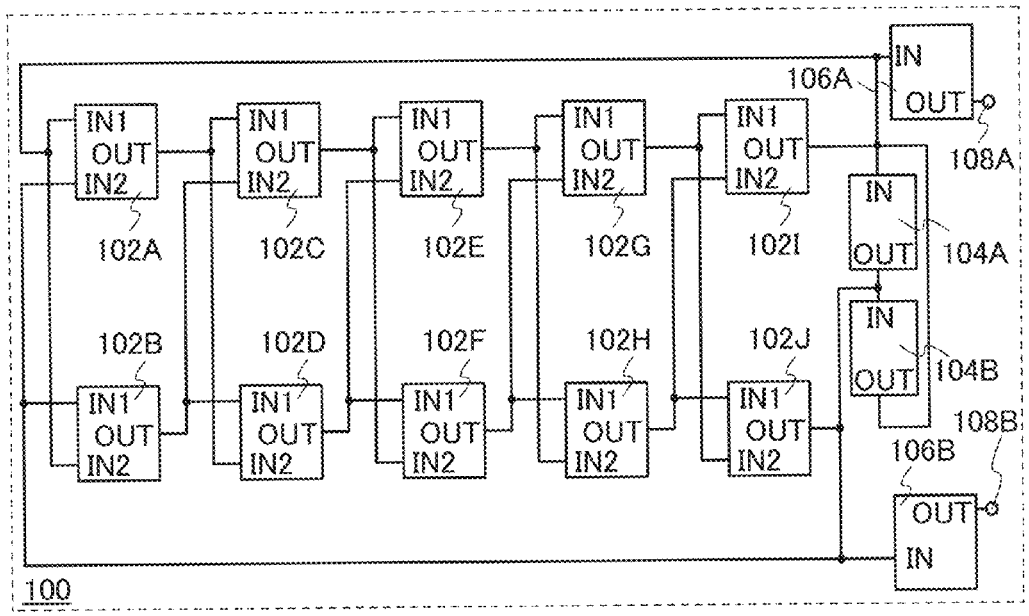
FIGS. 1A to 1D illustrate a ring oscillator of a semiconductor device in one embodiment of the present invention.

FIG. 1A illustrates a circuit 100 as a configuration example of a ring oscillator with five stages of inverters. The circuit 100 includes an inverter circuit 102A, an inverter circuit 102B, an inverter circuit 102C, an inverter circuit 102D, an inverter circuit 102E, an inverter circuit 102F, an inverter circuit 102G, an inverter circuit 102H, an inverter circuit 102I, an inverter circuit 102J, an inverter circuit 104A, an inverter circuit 104B, a buffer circuit 106A, a buffer circuit 106B, a signal output terminal 108A, and an inverted signal output terminal 108B.

Figure 1B:
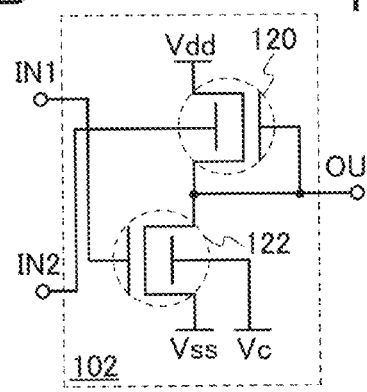

Note that each of the inverter circuit 102A, the inverter circuit 102B, the inverter circuit 102C, the inverter circuit 102D, the inverter circuit 102E, the inverter circuit 102F, the inverter circuit 102G the inverter circuit 102H, the inverter circuit 102I, and the inverter circuit 102J can have a configuration example of an inverter circuit 102 as shown in FIG. 1B.

Figure 1C:
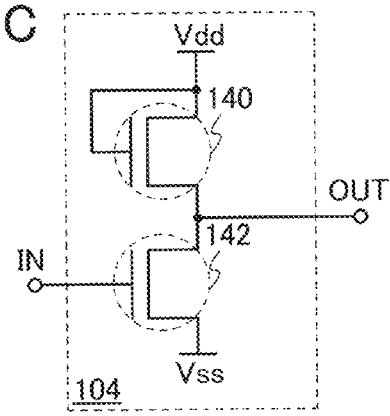

Note that each of the inverter circuit 104A and the inverter circuit 104B can have a configuration example of an inverter circuit 104 as shown in FIG. 1C.

Figure 1D:
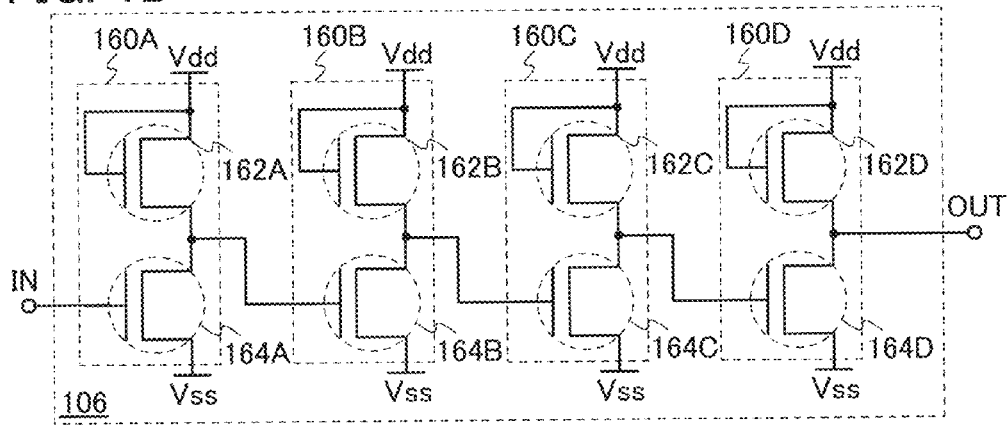

Note that each of the buffer circuit 106A and the buffer circuit 106B can have a configuration example of a buffer circuit 106 as shown in FIG. 1D.

The inverter circuit 102 has a first input terminal (denoted by "IN1" in FIGS. 1A and 1B), a second input terminal (denoted by "IN2" in FIGS. 1A and 1B), and an output terminal (denoted by "OUT" in FIGS. 1A and 1B).

The inverter circuit 104 has an input terminal (denoted by "IN" in FIGS. 1A and 1C) and an output terminal (denoted by "OUT" in FIGS. 1A and 1C).

The buffer circuit 106 has an input terminal (denoted by "IN" in FIGS. 1A and 1D) and an output terminal (denoted by "OUT" in FIGS. 1A and 1D).

Connections of the circuits in FIG. 1A will be described.

A first input terminal of the inverter circuit 102A and a second input terminal of the inverter circuit 102B are electrically connected to an input terminal of the buffer circuit 106A.

An output terminal of the inverter circuit 102A is electrically connected to a first input terminal of the inverter circuit 102C and a second input terminal of the inverter circuit 102D.

A second input terminal of the inverter circuit 102A and a first input terminal of the inverter circuit 102B are electrically connected to an input terminal of the buffer circuit 106B.

An output terminal of the inverter circuit 102B is electrically connected to a second input terminal of the inverter circuit 102C and a first input terminal of the inverter circuit 102D.

An output terminal of the inverter circuit 102C is electrically connected to a first input terminal of the inverter circuit 102E and a second input terminal of the inverter circuit 102F.

An output terminal of the inverter circuit 102D is electrically connected to a second input terminal of the inverter circuit 102E and a first input terminal of the inverter circuit 102F.

An output terminal of the inverter circuit 102E is electrically connected to a first input terminal of the inverter circuit 102G and a second input terminal of the inverter circuit 102H.

An output terminal of the inverter circuit 102F is electrically connected to a second input terminal of the inverter circuit 102G and a first input terminal of the inverter circuit 102H.

An output terminal of the inverter circuit 102G is electrically connected to a first input terminal of the inverter circuit 102I and a second input terminal of the inverter circuit 102J.

An output terminal of the inverter circuit 102H is electrically connected to a second input terminal of the inverter circuit 102I and a first input terminal of the inverter circuit 102J.

An output terminal of the inverter circuit 102I is electrically connected to the input terminal of the buffer circuit 106A, an input terminal of the inverter circuit 104A, and an output terminal of the inverter circuit 104B.

An output terminal of the inverter circuit 102J is electrically connected to an output terminal of the inverter circuit 104A, an input terminal of the inverter circuit 104B, and the input terminal of the buffer circuit 106B.

An output terminal of the buffer circuit 106A is electrically connected to the signal output terminal 108A, and an output terminal of the buffer circuit 106B is electrically connected to the inverted signal output terminal 108B.

FIG. 1B illustrates a configuration example of the inverter circuit 102. The inverter circuit 102 illustrated in FIG. 1B includes a first transistor 120 and a second transistor 122. One of a source and a drain of the first transistor 120 is electrically connected to a high power supply potential line Vdd. The other of the source and the drain of the first transistor 120 is electrically connected to one of a source and a drain of the second transistor 122 and the output terminal. The other of the source and the drain of the second transistor 122 is electrically connected to a low power supply potential line Vss. A first gate of the first transistor 120 is electrically connected to the other of the source and the drain of the first transistor 120 and the one of the source and the drain of the second transistor 122. A second gate of the first transistor 120 is electrically connected to the second input terminal of the inverter circuit 102. A first gate of the second transistor 122 is electrically connected to the first input terminal. A second gate of the second transistor 122 is electrically connected to a common potential line Vc.

Although two gates of each transistor are referred to here as a first gate and a second gate, which correspond to a gate and a back gate, respectively, there is no significant difference therebetween and these are interchangeable.

Note that the common potential line Vc here is a wiring at a constant potential for maintaining the second gate of the second transistor 122 at a constant potential.

FIG. 1C illustrates a configuration example of the inverter circuit 104. The inverter circuit 104 illustrated in FIG. 1C includes a first transistor 140 and a second transistor 142. One of a source and a drain of the first transistor 140 is electrically connected to the high power supply potential line Vdd. The other of the source and the drain of the first transistor 140 is electrically connected to one of a source and a drain of the second transistor 142 and the output terminal. The other of the source and the drain of the second transistor 142 is electrically connected to the low power supply potential line Vss. A gate of the first transistor 140 is electrically connected to the one of the source and the drain of the first transistor 140. A gate of the second transistor 142 is electrically connected to the input terminal.

FIG. 1D illustrates a configuration example of the buffer circuit 106. The buffer circuit 106 illustrated in FIG. 1D includes a circuit 160A, a circuit 160B, a circuit 160C, and a circuit 160D.

The circuit 160A includes a first transistor 162A and a second transistor 164A. One of a source and a drain of the first transistor 162A is electrically connected to the high power supply potential line Vdd. The other of the source and the drain of the first transistor 162A is electrically connected to one of a source and a drain of the second transistor 164A. The other of the source and the drain of the second transistor 164A is electrically connected to the low power supply potential line Vss. A gate of the first transistor 162A is electrically connected to the one of the source and the drain of the first transistor 162A. A gate of the second transistor 164A is electrically connected to the input terminal.

The circuit 160B includes a first transistor 162B and a second transistor 164B. One of a source and a drain of the first transistor 162B is electrically connected to the high power supply potential line Vdd. The other of the source and the drain of the first transistor 162B is electrically connected to one of a source and a drain of the second transistor 164B. The other of the source and the drain of the second transistor 164B is electrically connected to the low power supply potential line Vss. A gate of the first transistor 162B is electrically connected to the one of the source and the drain of the first transistor 162B. A gate of the second transistor 164B is electrically connected to the other of the source and the drain of the first transistor 162A and the one of the source and the drain of the second transistor 164A.

The circuit 160C includes a first transistor 162C and a second transistor 164C. One of a source and a drain of the first transistor 162C is electrically connected to the high power supply potential line Vdd. The other of the source and the drain of the first transistor 162C is electrically connected to one of a source and a drain of the second transistor 164C. The other of the source and the drain of the second transistor 164C is electrically connected to the low power supply potential line Vss. A gate of the first transistor 162C is electrically connected to the one of the source and the drain of the first transistor 162C. A gate of the second transistor 164C is electrically connected to the other of the source and the drain of the first transistor 162B and the one of the source and the drain of the second transistor 164B.

The circuit 160D includes a first transistor 162D and a second transistor 164D. One of a source and a drain of the first transistor 162D is electrically connected to the high power supply potential line Vdd. The other of the source and the drain of the first transistor 162D is electrically connected to one of a source and a drain of the second transistor 164D and the output terminal. The other of the source and the drain of the second transistor 164D is electrically connected to the low power supply potential line Vss. A gate of the first transistor 162D is electrically connected to the one of the source and the drain of the first transistor 162D. A gate of the second transistor 164D is electrically connected to the other of the source and the drain of the first transistor 162C and the one of the source and the drain of the second transistor 164C.

Next, an operation of the circuit 100 illustrated in FIG. 1A will be described.

First, power is supplied to the circuit 100 so that the potentials of the high power supply potential line Vdd, the low power supply potential line Vss, and the common potential line Vc are set to Vdd, Vss, and Vc, respectively. It is preferable that the potential of the common potential line Vc can be controlled so as to be a given potential.

Here, attention is focused on the inverter circuit 102A. Even when the potentials of the first input terminal and the second input terminal of the inverter circuit 102A are unstable shortly after the power is supplied, the potential of the output terminal temporarily becomes a certain potential as a result of a supply of potentials to the high power supply potential line Vdd, the low power supply potential line Vss, and the common potential line Vc. This depends on which of the two transistors, the first transistor 120 or the second transistor 122, is more easily turned on. In the case where the first transistor 120 is more easily turned on, the potential of the output terminal becomes the potential of the high power supply potential line Vdd (i.e., a high-level potential, which is hereinafter referred to as "H-level"), and in the case where the second transistor 122 is more easily turned on, the potential of the output terminal becomes the potential of the low power supply potential line Vss (i.e., a low-level potential, which is hereinafter referred to as "L-level").

The potentials of the output terminals of the inverter circuits 102C and 102D which are electrically connected to the output terminal of the inverter circuit 102A also become the H-level or the L-level, like that of the output potential of the inverter circuit 102A. Note that a signal (potential) of the output terminal of the inverter circuit 102C is opposite to a signal (potential) of the output terminal of the inverter circuit 102A except in a transition period. That is, in the case where the output terminal of the inverter circuit 102A is at the H-level, the output terminal of the inverter circuit 102C is at the L-level, and in the case where the output terminal of the inverter circuit 102A is at the L-level, the output terminal of the inverter circuit 102C is at the H-level.

In addition, a signal (potential) of the output terminal of the inverter circuit 102D is opposite to a signal (potential) of the output terminal of the inverter circuit 102C, except in a transition period. That is, in the case where the output terminal of the inverter circuit 102C is at the H-level, the output terminal of the inverter circuit 102D is at the L-level, and in the case where the output terminal of the inverter circuit 102C is at the L-level, the output terminal of the inverter circuit 102D is at the H-level.

In this manner, the inverter circuit 102 outputs a signal opposite to that of the output terminal of the inverter circuit in the previous stage (e.g., the inverter circuit 102A in the case of the inverter circuit 102C). Furthermore, the inverter circuits 102 adjacent to each other (in the same stage) (e.g., the inverter circuit 102C and the inverter circuit 102D) output signals of opposite polarities from the output terminals.

For example, in the case where the output terminal of the inverter circuit 102A is at the H-level, the output terminal of the inverter circuit 102B is at the L-level, the output terminal of the inverter circuit 102C is at the L-level, the output terminal of the inverter circuit 102D is at the H-level, the output terminal of the inverter circuit 102E is at the H-level, the output terminal of the inverter circuit 102F is at the L-level, the output terminal of the inverter circuit 102G is at the L-level, the output terminal of the inverter circuit 102H is at the H-level, the output terminal of the inverter circuit 102I is at the H-level, and the output terminal of the inverter circuit 102J is at the L-level. Then, since the output terminal of the inverter circuit 102I electrically connected to the first input terminal of the inverter circuit 102A is at the H-level and the output terminal of the inverter circuit 102J electrically connected to the first input terminal of the inverter circuit 102B is at the L-level, the potential of the output terminal of the inverter circuit 102A becomes the L-level and the potential of the output terminal of the inverter circuit 102B becomes the H-level. That is, the output signals of the inverter circuits 102 are all inverted, and this is repeated. It can be said that the circuit 100 can operate in this manner as an oscillator circuit.

Here, attention is focused on the inverter circuit 102 again. The first transistor 120 and the second transistor 122 each include the first gate and the second gate, and these transistors are dual-gate transistors. In the case where the first input terminal is at the H-level, the second transistor 122 is turned on. At this time, since the second input terminal is at the L-level, the first transistor 120 is turned off.

Thus, the first transistor 120 and the second transistor 122 have a very high on/off ratio. Therefore, signals output from the signal output terminal 108A and the inverted signal output terminal 108B have higher frequencies and larger amplitudes than those from a conventional oscillator circuit.

Note that the buffer circuit 106 has a function of amplifying an output signal (current). In the configuration illustrated in FIG. 1D, the buffer circuit 106 includes four stages of inverters, and outputs an H-level signal when an input signal is at the H-level and outputs an L-level signal when the input signal is at the L-level. Note that the buffer circuit 106 is not limited to the configuration illustrated in FIG. 1D and may include any other even number of stages of inverters. Note that the buffer circuit 106 is not limited to a configuration including an even number of stages of inverters as long as it has a function of amplifying an output signal (current).

The inverter circuits 104A and 104B are provided in order to maintain signals from the output terminals of the inverters in the last stage. That is, in the case where the output terminal of the inverter circuit 102I is at the H-level and the output terminal of the inverter circuit 102J is at the L-level, the inverter circuits 104A and 104B maintain these signals, and in the case where the output terminal of the inverter circuit 102I is at the L-level and the output terminal of the inverter circuit 102J is at the H-level, the inverter circuits 104A and 104B maintain these signals.

As described above, the circuit 100 functions as a ring oscillator. As in the above description, an inverter can be formed using a transistor having a back gate without any circuit provided to generate a potential to be input to the back gate. In addition, even when an inverter is formed using a transistor having a back gate, the number of wirings for supplying signals can be reduced.

Note that the present invention is not limited thereto and a ring oscillator of a semiconductor device in one embodiment of the present invention may be electrically connected to a selector circuit (not illustrated), in which case the reliability can be improved.

For example, a case is considered in which the inverter circuit 102B has a defect and the potential of its output terminal is unstable.

The output terminal of the inverter circuit 102B is electrically connected to the inverter circuit 102C and the inverter circuit 102D. Here, attention is focused on the inverter circuit 102D. The potential of the first input terminal of the inverter circuit 102D becomes unstable, the drain current of the second transistor 122 of the inverter circuit 102D changes significantly, and the output of the inverter circuit 102D also becomes unstable. Similarly, the potentials of the output terminals of the inverter circuit 102F, the inverter circuit 102H, and the inverter circuit 102J also become unstable, leading to malfunction. Note that in many cases, the potentials of the output terminals of the inverter circuit 102B, the inverter circuit 102D, the inverter circuit 102F, the inverter circuit 102H, and the inverter circuit 102J each become a certain potential.

Meanwhile, when attention is focused on the inverter circuit 102C, the second input terminal of the inverter circuit 102C electrically connected to the output terminal of the inverter circuit 102B becomes unstable and the potential of the second gate (back gate) of the first transistor 120 of the inverter circuit 102C also becomes unstable. However, the drain current is not significantly affected. Similarly, the defect of the inverter circuit 102B does not significantly affect the inverter circuit 102A, the inverter circuit 102C, the inverter circuit 102E, the inverter circuit 102G, and the inverter circuit 102I. Therefore, even when the inverter circuit 102B has a defect, the inverter circuit 102A, the inverter circuit 102C, the inverter circuit 102E, the inverter circuit 102G, and the inverter circuit 102I can operate normally.

Therefore, even when the inverter circuit 102B has a defect, the normal operation of the inverter circuit 102A, the inverter circuit 102C, the inverter circuit 102E, the inverter circuit 102G, and the inverter circuit 102I enables the circuit 100 to operate normally as a ring oscillator.

Note that there is no particular limitation on the configuration of the selector circuit, and any circuit that can select an output signal can be employed.

Note that in the case of using the selector circuit, a circuit for detecting a defect is preferably provided. In the above example, since a defect of the inverter circuit 102B can cause the potentials of the output terminals of the inverter circuit 102B, the inverter circuit 102D, the inverter circuit 102F, the inverter circuit 102H, and the inverter circuit 102J to each become a certain potential, a circuit for detecting this is preferably provided.

As described above, the circuit 100 is a semiconductor device including a ring oscillator or an inverter chain having high reliability.

Note that the present invention is not limited to the above-described configuration example of the circuit 100 with five stages of inverters. Although not illustrated, the circuit 100 may include seven stages of inverters or nine stages of inverters. When the circuit 100 includes an odd number of stages of inverters, a ring oscillator which operates as an oscillator circuit can be obtained.

The inverter circuits 104 are referred to here as end inverter circuits. In the case where the configuration of the circuit 100 is generalized, one embodiment of the present invention is a semiconductor device which includes a circuit including $2k$ inverter circuits, first and second end inverter circuits, and first and second buffer circuits. The circuit has the following configuration. A first input terminal of a first inverter circuit and a second input terminal of a second inverter circuit are electrically connected to an input terminal of a first buffer circuit. An output terminal of the first inverter circuit is electrically connected to a first input terminal of a third inverter circuit and a second input terminal of a fourth inverter circuit. A second input terminal of the first inverter circuit and a first input terminal of the second inverter circuit are electrically connected to an input terminal of a second buffer circuit. An output terminal of the second inverter circuit is electrically connected to a second input terminal of the third inverter circuit and a first input terminal of the fourth inverter circuit. An output terminal of a $(2n-1)$-th inverter circuit (n is a natural number greater than or equal to 2) is electrically connected to a first input terminal of a $(2n+1)$-th inverter circuit and a second input terminal of a $(2n+2)$-th inverter circuit. An output terminal of a $2n$-th inverter circuit is electrically connected to a second input terminal of the $(2n+1)$-th inverter circuit and a first input terminal of the $(2n+2)$-th inverter circuit. An output terminal of a $(2k-3)$-th inverter circuit is electrically connected to a first input terminal of a $(2k-1)$-th inverter circuit and a second input terminal of a $2k$-th inverter circuit. An output terminal of a $(2k-2)$-th inverter circuit is electrically connected to a second input terminal of the $(2k-1)$-th inverter circuit and a first input terminal of the $2k$-th inverter circuit. An output terminal of the $(2k-1)$-th inverter circuit is electrically connected to the input terminal of the first buffer circuit, an input terminal of a first end inverter circuit, and an output terminal of a second end inverter circuit. An output terminal of the 2k-th inverter circuit is electrically connected to an output terminal of the first end inverter circuit, an input terminal of the second end inverter circuit, and the input terminal of the second buffer circuit. The inverter circuits each include a first transistor and a second transistor. One of a source and a drain of the first transistor is electrically connected to a high power supply potential line. The other of the source and the drain of the first transistor is electrically connected to one of a source and a drain of the second transistor and the output terminal. The other of the source and the drain of the second transistor is electrically connected to a low power supply potential line. A first gate of the first transistor is electrically connected to the other of the source and the drain of the first transistor and the one of the source and the drain of the second transistor. A second gate of the first transistor is electrically connected to the second input terminal of the inverter circuit. A first gate of the second transistor is electrically connected to the first input terminal. A second gate of the second transistor is electrically connected to a common potential line. The first end inverter circuit and the second end inverter circuit each include a third transistor and a fourth transistor. One of a source and a drain of the third transistor is electrically connected to the high power supply potential line. The other of the source and the drain of the third transistor is electrically connected to one of a source and a drain of the fourth transistor and the output terminal. The other of the source and the drain of the fourth transistor is electrically connected to the low power supply potential line. A gate of the third transistor is electrically connected to the one of the source and the drain of the third transistor. A gate of the fourth transistor is electrically connected to the input terminal. The first buffer circuit and the second buffer circuit each include a plurality of inverters.

Note that in the semiconductor device in one embodiment of the present invention, all transistors in at least a portion corresponding to the circuit 100 have the same conductivity type; therefore, the degree of freedom for layout is higher than in the case of using CMOS.

Note that only the inverter circuit 102A, the inverter circuit 102C, the inverter circuit 102E, the inverter circuit 102G, and the inverter circuit 102I (only an odd-numbered row) in the circuit 100 can operate as a ring oscillator. Similarly, only the inverter circuit 102B, the inverter circuit 102D, the inverter circuit 102F, the inverter circuit 102H, and the inverter circuit 102J (only an even-numbered row) in the circuit 100 can operate as a ring oscillator. Therefore, even when a transistor has a defect due to a failure in a manufacturing process or the like, only a row without any defect can be used to achieve operation as a ring oscillator. Thus, the operation of the semiconductor device itself can be prevented from stopping. Accordingly, it can be said that the semiconductor device in one embodiment of the present invention has high reliability.

For operation of only either of the rows, a selector circuit such as a multiplexer may be used.

Note that in the case where only a row without any defect is used to achieve operation as a ring oscillator, the advantage of a ring oscillator operating with both the odd-numbered and even-numbered rows cannot be obtained because the back gates do not function.

Note that all the transistors in this embodiment can be transistors whose channels are formed in an oxide semiconductor (referred to as OS transistors). OS transistors can achieve significantly small off-state current by minimization of hydrogen, water, or the like contained therein and minimization of oxygen vacancies. Therefore, when all the transistors in this embodiment are OS transistors, a ring oscillator (oscillator circuit) with low power consumption can be obtained. Such a ring oscillator with low power consumption is preferably used in a display, for example.

EXAMPLE 1

In this example, a seven-stage ring oscillator configured as described in the embodiment will be described. The ring oscillator of this example includes 14 inverter circuits 102, two inverter circuits 104, and two buffer circuits 106, and all transistors are transistors whose channel regions are formed in an oxide semiconductor.

Transistors provided in the inverter circuits 102 each have a channel length of 10 μm and a channel width of 100 μm.

Transistors provided in each of the inverter circuits 104 are a transistor on the high power supply potential line Vdd side which has a channel length of 10 μm and a channel width of 20 μm (corresponding to the first transistor 140 in FIG. 1C) and a transistor on the low power supply potential line Vss side which has a channel length of 10 μm and a channel width of 200 μm (corresponding to the second transistor 142 in FIG. 1C).

The buffer circuits 106 each include a transistor corresponding to the first transistor 162A which has a channel length of 10 μm and a channel width of 20 μm, a transistor corresponding to the first transistor 162B which has a channel length of 10 μm and a channel width of 80 μm, a transistor corresponding to the first transistor 162C which has a channel length of 10 μm and a channel width of 80 μm, a transistor corresponding to the first transistor 162D which has a channel length of 10 μm and a channel width of 1600 μm, a transistor corresponding to the second transistor 164A which has a channel length of 10 μm and a channel width of 200 μm, a transistor corresponding to the second transistor 164B which has a channel length of 10 μm and a channel width of 800 μm, a transistor corresponding to the second transistor 164C which has a channel length of 10 μm and a channel width of 800 μm, and a transistor corresponding to the second transistor 164D which has a channel length of 10 μm and a channel width of 160 μm.

Note that in each of the buffer circuits 106, a measurement pad is provided at an output portion of each inverter included in the buffer circuit 106.

Figure 2A:
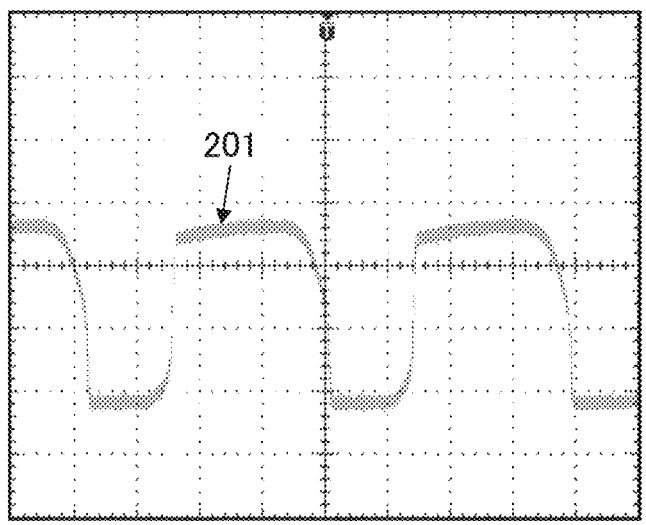
FIGS. 2A to 2C show output waveforms of a ring oscillator of a semiconductor device in Example 1.
Figure 2B:
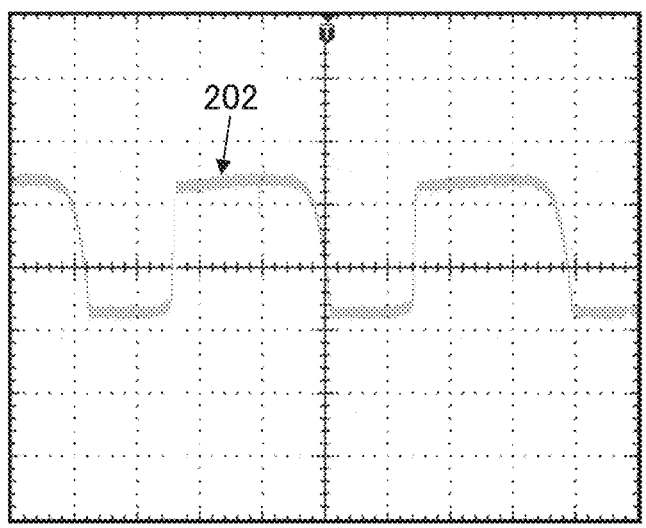
Figure 2C:
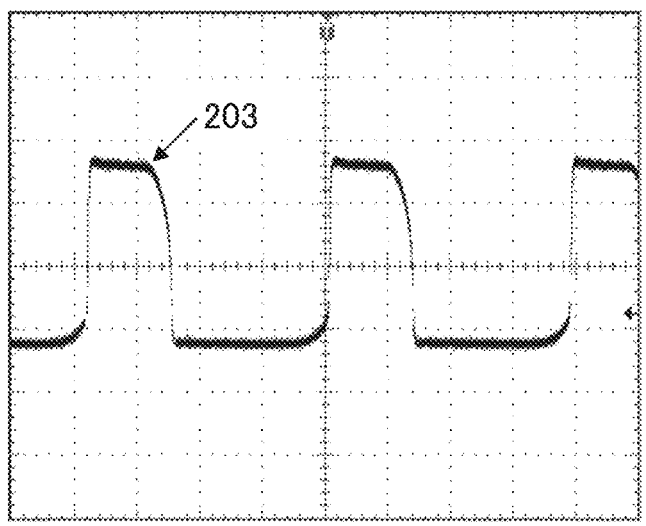

FIGS. 2A to 2C show waveforms of the ring oscillator of this example in operation. Here, the potential of the high power supply potential line Vdd is 12.1 V, the potential of the low power supply potential line Vss is 0 V, and the potential of the common potential line Vc is −2 V.

Here, a first waveform 201 shown in FIG. 2A is a waveform at an output terminal of the inverter circuit 102 in the upper row of the last stage (corresponding to a waveform at an input terminal of the buffer circuit 106A in FIGS. 1A and 1D).

A second waveform 202 shown in FIG. 2B is a waveform at the signal output terminal 108A.

A third waveform 203 shown in FIG. 2C is a waveform at the inverted signal output terminal 108B.

As shown in FIGS. 2A to 2C, a ring oscillator included in a semiconductor device in one embodiment of the present invention can operate as an oscillator circuit.

This application is based on Japanese Patent Application serial no. 2012-105278 filed with Japan Patent Office on May 2, 2012, the entire contents of which are hereby incorporated by reference.

What is claimed is:
1. A semiconductor device comprising:
   a plurality of inverter stages each comprising a first inverter circuit and a second inverter circuit connected in parallel to each other, each of the first inverter circuit and the second inverter circuit comprising a transistor having a first gate and second gate, wherein the first inverter circuit and the second inverter circuit are configured to output respective signals of opposite polarities and to interchange signals output from two inverter circuits in a previous stage, wherein an input signal for the first inverter circuit is the same as a signal input to the second gate of the transistor included in the second inverter circuit, and wherein an input signal for the second inverter circuit is the same as a signal input to the second gate of the transistor included in the first inverter circuit.

2. The semiconductor device according to claim 1, wherein a channel region of the transistor comprises an oxide semiconductor.

3. The semiconductor device according to claim 1, wherein the semiconductor device is one of a ring oscillator and an inverter chain.

4. A semiconductor device comprising an odd number of inverter stages each comprising a first inverter circuit and a second inverter circuit connected in parallel to each other, wherein each of the first inverter circuit and the second inverter circuit comprises:
a first input terminal;
a second input terminal;
an output terminal configured to output an inverted signal of a signal input from the first input terminal; and
two transistors each having a first gate and a second gate,
wherein the output terminal of the first inverter circuit is electrically connected to a first input terminal of a first inverter circuit in a subsequent stage and a second input terminal of a second inverter circuit in the subsequent stage,
wherein the output terminal of the second inverter circuit is electrically connected to a second input terminal of the first inverter circuit in the subsequent stage and a first input terminal of the second inverter circuit in the subsequent stage, and
wherein the second input terminal of each of the first inverter circuit and the second inverter circuit is electrically connected to the second gate of one of the two transistors.

5. The semiconductor device according to claim 4, wherein a channel region of each of the two transistors comprises an oxide semiconductor.

6. The semiconductor device according to claim 4, wherein the two transistors have the same conductivity type.

7. The semiconductor device according to claim 4, wherein the semiconductor device is one of a ring oscillator and an inverter chain.

8. A semiconductor device comprising:
first, second, third, fourth, . . . , and 2k-th inverter circuits, each of the inverter circuits comprising a first transistor and a second transistor;
a first buffer circuit and a second buffer circuit; and
a first end inverter circuit and a second end inverter circuit,
wherein a first input terminal of the first inverter circuit and a second input terminal of the second inverter circuit are electrically connected to an input terminal of the first buffer circuit,
wherein an output terminal of the first inverter circuit is electrically connected to a first input terminal of the third inverter circuit and a second input terminal of the fourth inverter circuit, wherein a second input terminal of the first inverter circuit and a first input terminal of the second inverter circuit are electrically connected to an input terminal of the second buffer circuit, wherein an output terminal of the second inverter circuit is electrically connected to a second input terminal of the third inverter circuit and a first input terminal of the fourth inverter circuit, wherein an output terminal of a (2n−1)-th inverter circuit (n is a natural number greater than or equal to 2) is electrically connected to a first input terminal of a (2n+1)-th inverter circuit and a second input terminal of a (2n+2)-th inverter circuit, wherein an output terminal of a 2n-th inverter circuit is electrically connected to a second input terminal of the (2n+1)-th inverter circuit and a first input terminal of the (2n+2)-th inverter circuit, wherein an output terminal of a (2k−3)-th inverter circuit is electrically connected to a first input terminal of a (2k−1)-th inverter circuit and a second input terminal of the 2k-th inverter circuit, wherein an output terminal of a (2k−2)-th inverter circuit is electrically connected to a second input terminal of the (2k−1)-th inverter circuit and a first input terminal of the 2k-th inverter circuit, wherein an output terminal of the (2k−1)-th inverter circuit is electrically connected to the input terminal of the first buffer circuit, an input terminal of the first end inverter circuit, and an output terminal of the second end inverter circuit, wherein an output terminal of the 2k-th inverter circuit is electrically connected to an output terminal of the first end inverter circuit, an input terminal of the second end inverter circuit, and the input terminal of the second buffer circuit, and wherein each of the first transistor and the second transistor comprises a first gate and a second gate.

9. The semiconductor device according to claim 8,
wherein one of a source and a drain of the first transistor is electrically connected to a high power supply potential line,
wherein the other of the source and the drain of the first transistor is electrically connected to one of a source and a drain of the second transistor and the output terminal, and
wherein the other of the source and the drain of the second transistor is electrically connected to a low power supply potential line.

10. The semiconductor device according to claim 9,
wherein the first gate of the first transistor is electrically connected to the other of the source and the drain of the first transistor and the one of the source and the drain of the second transistor, and
wherein the second gate of the first transistor is electrically connected to the second input terminal of one of the inverter circuits.

11. The semiconductor device according to claim 8,
wherein the first gate of the second transistor is electrically connected to the first input terminal, and
wherein the second gate of the second transistor is electrically connected to a common potential line.

12. The semiconductor device according to claim 8, wherein each of the first end inverter circuit and the second end inverter circuit comprises a third transistor and a fourth transistor.

13. The semiconductor device according to claim 12,
wherein one of a source and a drain of the third transistor is electrically connected to a high power supply potential line,
wherein the other of the source and the drain of the third transistor is electrically connected to one of a source and a drain of the fourth transistor and the output terminal, and
wherein the other of the source and the drain of the fourth transistor is electrically connected to a low power supply potential line.

14. The semiconductor device according to claim 13,
wherein a gate of the third transistor is electrically connected to the one of the source and the drain of the third transistor, and
wherein a gate of the fourth transistor is electrically connected to the input terminal.

15. The semiconductor device according to claim 8, wherein each of the first buffer circuit and the second buffer circuit comprises a plurality of inverters.

16. The semiconductor device according to claim 8, wherein k=7.

17. The semiconductor device according to claim 8, wherein a channel region of each of the first, second, third, and fourth transistors comprises an oxide semiconductor.

18. The semiconductor device according to claim 8, wherein the first, second, third, and fourth transistors have the same conductivity type.

19. The semiconductor device according to claim 8, wherein the semiconductor device is one of a ring oscillator and an inverter chain.

* * * * *